(12) United States Patent
Igarashi et al.

(10) Patent No.: US 7,956,677 B2
(45) Date of Patent: Jun. 7, 2011

(54) SEMICONDUCTOR INTEGRATED CIRCUIT AND POWER-SUPPLY CONTROL METHOD

(75) Inventors: Masahiro Igarashi, Kanagawa (JP); Tetsuo Motomura, Kanagawa (JP); Ryuji Kaneko, Tokyo (JP); Makoto Fujiwara, Tokyo (JP); Yoshinori Tanaka, Tokyo (JP); Hiromi Ogata, Kanagawa (JP)

(73) Assignee: Sony Corporation, Tokyo (JP)

( * ) Notice: Subject to any disclaimer, the term of this patent is extended or adjusted under 35 U.S.C. 154(b) by 123 days.

(21) Appl. No.: 12/318,934

(22) Filed: Jan. 13, 2009

(65) Prior Publication Data
US 2009/0179688 A1    Jul. 16, 2009

(30) Foreign Application Priority Data
Jan. 16, 2008   (JP) ................ 2008-006955

(51) Int. Cl.
*H03K 17/72* (2006.01)
(52) U.S. Cl. ............... 327/544; 327/530; 326/93
(58) Field of Classification Search ........ 326/93, 326/95, 98; 327/434, 530, 544; 365/230.05; 307/38, 115
See application file for complete search history.

(56) References Cited

U.S. PATENT DOCUMENTS

| | | | |
|---|---|---|---|
| 6,876,252 B2 * | 4/2005 | Kim et al. | 327/544 |
| 7,138,825 B2 * | 11/2006 | Kim et al. | 326/34 |
| 7,486,108 B2 * | 2/2009 | Kim et al. | 326/34 |
| 7,723,867 B2 * | 5/2010 | Willingham et al. | 307/80 |
| 7,737,720 B2 * | 6/2010 | Idgunji et al. | 326/33 |
| 2009/0115256 A1 * | 5/2009 | Flynn et al. | 307/115 |

FOREIGN PATENT DOCUMENTS

| | | |
|---|---|---|
| JP | 01-173761 A | 7/1989 |
| JP | 11-297849 A | 10/1999 |
| JP | 2003-168735 A | 6/2003 |
| JP | 2003-179079 A | 6/2003 |
| JP | 2003-289245 A | 10/2003 |
| JP | 2004-048962 A | 2/2004 |
| JP | 2004-229193 A | 8/2004 |
| JP | 2005-065044 A | 3/2005 |
| JP | 2007-267162 A | 10/2007 |
| JP | 2007-329170 A | 12/2007 |

OTHER PUBLICATIONS

Japanese Office Action issued Feb. 16, 2010 for corresponding Japanese Application No. 2008-006955.

* cited by examiner

*Primary Examiner* — Vibol Tan
(74) *Attorney, Agent, or Firm* — Rader, Fishman & Grauer PLLC

(57) ABSTRACT

A semiconductor integrated circuit includes: a first voltage line on which a specific one of a power-supply voltage and a reference voltage appears; a second voltage line; a plurality of circuit cells each receiving power generated as a difference between a voltage appearing on the second voltage line and the other one of the power-supply voltage and the reference voltage; a plurality of switch transistors connected in parallel between the first and second voltage lines to serve as switch transistors including switch transistors each having different conducting-state resistances; and a switch conduction control section for controlling a transition of each of the switch transistors from a non-conducting state to a conducting state by turning on the switch transistors at separate points of time.

13 Claims, 10 Drawing Sheets

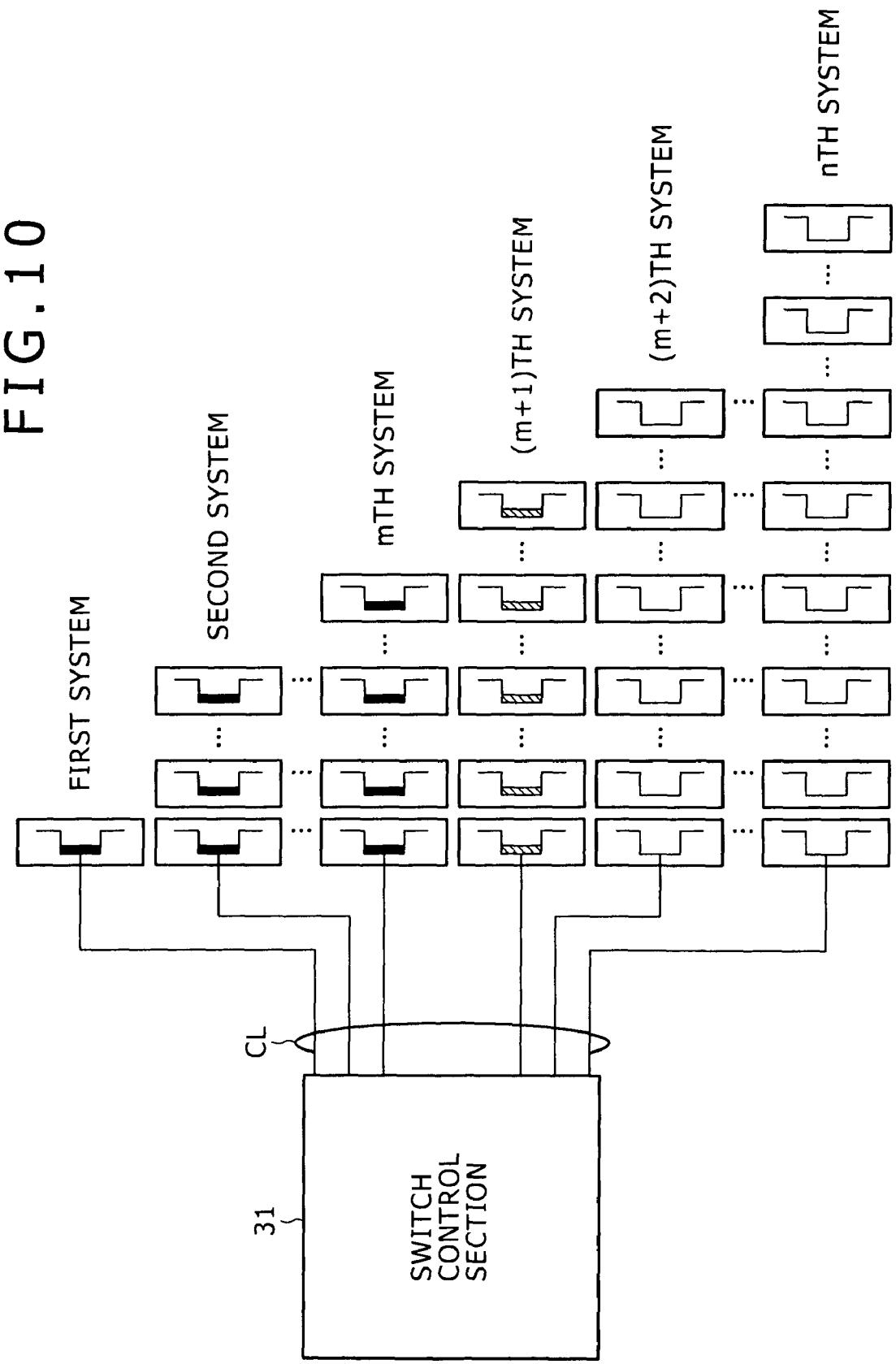

SEMICONDUCTOR INTEGRATED CIRCUIT AND POWER-SUPPLY CONTROL METHOD

CROSS REFERENCES TO RELATED APPLICATIONS

The present invention contains subject matter related Japanese Patent Application JP 2008-006955 filed in the Japan Patent Office on Jan. 16, 2008, the entire contents of which being incorporated herein by reference.

BACKGROUND OF THE INVENTION

1. Field of the Invention

The present invention relates to a semiconductor integrated circuit for controlling a transition of a plurality of switch transistors, which are used for supplying power to a plurality of circuit cells and cutting off the supply of power to the circuit cells, from a turned-off state to a turned-on state and relates to a power-supply control method for controlling such a transition.

2. Description of the Related Art

A MTCMOS (Multi-threshold Complementary Metal Oxide Semiconductor) technology is known as a technology for controlling switch transistors, which are used for supplying power to a circuit and cutting off the supply of power to the circuit.

The threshold voltage of a transistor employed in a logic circuit or the like is a typical design value. In general, it is necessary to reduce the threshold voltage so that no signal delay is generated due to a decreased power-supply voltage and/or a miniaturized device. If the threshold voltage of a transistor employed in a logic circuit or the like is small, a leak current flowing through the transistor is large. In accordance with the MTCMOS technology, a transistor as a power-supply switch is designed to have a large threshold voltage for a circuit in a stopped state in comparison with a transistor employed in a logic circuit or the like and is used for breaking a leak current path of the logic circuit or the like in order to prevent its power from being consumed wastefully.

In an application of the MTCMOS technology to a circuit block, local voltage lines referred to as the so-called virtual VDD line and the so-called virtual GND line are provided locally in the circuit block. The local voltage lines are each connected to a real voltage line and a real reference-voltage line respectively through a switch transistor for supplying power to the circuit block and cutting off the supply of power to the circuit block. Referred to as a real VDD line and a real VSS line respectively, the real voltage line and the real reference-voltage line are common global voltage lines outside the circuit block.

A switch transistor is provided between the real VDD line and a functional circuit which is started and stopped repeatedly. As an alternative, a switch transistor is provided between the real VSS line and such a functional circuit. As another alternative, a switch transistor is provided between the real VDD line and such a functional circuit whereas a switch transistor is provided between the real VSS line and the functional circuit. Normally, the switch transistor provided between the real VDD line and a functional circuit is a p-channel metal oxide semiconductor (PMOS) transistor whereas a switch transistor provided between the real VSS line and a functional circuit is an n-channel metal oxide semiconductor (NMOS) transistor.

Operations to activate and stop a functional circuit included in an MTCMOS applied block are controlled by a circuit included in a non-MTCMOS applied block which receives power from the real VDD line and the real VSS line, entering an operating state at normal times, after a semiconductor integrated circuit has been activated. The non-MTCMOS applied block also includes the switch control circuit which controls operations to turn on and off the switch transistor for supplying power to circuit cells and cutting off the supply of power to the cells. In addition to the switch conduction control circuit, the non-MTCMOS applied block also include circuits, such as a clock generation circuit and another repeater buffer, used mainly for controlling the entire integrated circuit (IC) and storing data representing input/output signals.

If the stopped time of the functional circuit in the MTCMOS applied block is long, it is quite within the bounds of possibility that the local voltage line such as the virtual VSS line is electrically charged with a leak current flowing from another internal circuit and raised to a high electric potential close to the real VDD line. Thus, when a power-supply cutting-off switch transistor is turned on at the time the functional circuit in the MTCMOS applied block is reactivated, electrical discharging of the virtual VSS line causes an accidental current to flow to the real VSS line. This accidental current is referred to as, for example, a rush current. As the rush current flows to the real VDD line, the current becomes a positive noise potential and propagates to a non-MTCMOS applied block adjacent to the MTCMOS applied block.

A phenomenon similar to that described above may occurs on the real VDD line. Since the accidental current flows from the real VDD line, a negative noise potential appears, which drops the potential on the real VDD line abruptly.

In either case, these noise voltages caused by power-supply noises propagate to circuits operating in an adjacent circuit block and cause a steep decrease of the power-supply voltage amplitude, giving rise to a delay effect such as generation of an operation delay as a result. The circuits operating in an adjacent circuit block include a clock generator circuit and/or a repeater buffer.

As a countermeasure against the power-supply noises, Philippe Royannez etc., "90 nm Low Leakage SoC Design Technique for Wireless Application," 2005 IEEE International Solid-State Circuits Conference, DIGEST OF TECHNICAL PAPERS, P138 (referred to as non-patent document 1), for example, discloses a technology according to which a plurality of PMOS switch transistors are connected in parallel between the global real VDD line and the local virtual VDD line and control signals each applied to the gate of one of the transistors are each delayed in order to gradually reduce the impedance of connection between the global real VDD line and the local virtual VDD line.

SUMMARY OF THE INVENTION

In accordance with the technology disclosed in non-patent document 1, however, even though the peak of the power-supply noises can be repressed, the technology has long time to execute the control.

A semiconductor integrated circuit according to an embodiment of the present invention includes: a first voltage line on which a specific one of a power-supply voltage and a reference voltage appears; a second voltage line; a plurality of circuit cells each receiving power generated as a difference between a voltage appearing on the second voltage line and the other one of the power-supply voltage and the reference voltage; and a plurality of switch transistors connected in parallel between the first and second voltage lines to serve as switch transistors including switch transistors having conducting-state resistances which are different from each other.

The circuit further includes a switch conduction control section configured to control a transition of each of the switch transistors from a non-conducting state to a conducting state at separate points of time while abiding by a rule stating: "Any specific one of the switch transistors shall be put in a conducting state only after all the switch transistors each having a conducting-state resistance greater than the conducting-state resistance of the specific switch transistor have been put in a conducting state."

It is possible to provide the embodiment of the present invention with a desirable configuration in which each of the switch transistors employs a plurality of unit transistors which are controlled by the switch conduction control section to be turned on or turned off at the same time and have a uniform conducting-state resistance.

As an alternative, it is possible to provide the embodiment of the present invention with another desirable configuration in which, when controlling a transition of each of the switch transistors from a non-conducting state to a conducting state at separate points of time, the switch conduction control section fixes the number of the switch transistors to be controlled at the same point of time for each of the points of time.

As another alternative, it is possible to provide the embodiment of the present invention with a further desirable configuration in which, when controlling a transition of each of the switch transistors from a non-conducting state to a conducting state at separate points of time, the switch conduction control section gradually increases the number of the switch transistors to be controlled at the same point of time.

It is also possible to provide the embodiment of the present invention with a still further desirable configuration in which, when controlling a transition of each of the switch transistors from a non-conducting state to a conducting state at separate points of time, the switch conduction control section gradually decreases time intervals of conduction controls.

A semiconductor integrated circuit according to another embodiment of the present invention includes: a first voltage line on which a specific one of a power-supply voltage and a reference voltage appears; a second voltage line; a plurality of circuit cells each receiving power generated as a difference between a voltage appearing on the second voltage line and the other one of the power-supply voltage and the reference voltage; a plurality of switch transistors connected in parallel between the first and second voltage lines; and a switch conduction control section configured to control a transition of each of the switch transistors from a non-conducting state to a conducting state at a plurality of time intervals of conduction controls including at least a specific time interval shorter than a preceding time interval.

A power-supply control method implemented by an embodiment of the present invention to serve as a power-supply control method to be adopted by a semiconductor integrated circuit. The circuit includes: a first voltage line on which a specific one of a power-supply voltage and a reference voltage appears; a second voltage line; a plurality of switch transistors connected in parallel between the first and second voltage lines to serve as switch transistors including switch transistors having conducting-state resistances which are different from each other; and a plurality of circuit cells each receiving power generated as a difference between a voltage appearing on the second voltage line and the other one of the power-supply voltage and the reference voltage. The power-supply control method is adopted by the semiconductor integrated circuit for controlling an operation to supply power to the circuit cells by putting each of the switch transistors in a turned-off state or a turned-on state through a conduction control of a transition of each of the switch transistors from a non-conducting state to a conducting state at separate points of time while abiding by a rule stating: "Any specific one of the switch transistors shall be put in a conducting state only after all the switch transistors each having a conducting-state resistance greater than the conducting-state resistance of the specific switch transistor have been put in a conducting state."

It is possible to provide the semiconductor integrated circuit adopting the power-supply control method according to the embodiment with a desirable configuration in which: each of the switch transistors is configured to include a plurality of unit transistors having uniform conducting-state resistances, controlled through the conduction control to be turned off and turned on at the same point of time; and during the conduction control, the number of the unit transistors to be controlled simultaneously at the same point of time is made gradually greater.

In accordance with the configuration described above, when the circuit cells are recovered from a stopped state to enter an operating state for example, the switch conduction control section controls the switch transistors to make a transition from the turned-off state to the turned-on state.

To put it in detail, the switch conduction control section controls each of the switch transistors from a conducting state to a non-conducting state by turning on the switch transistors at separate points of time while abiding by a rule stating: "Any specific one of the switch transistors shall be put in a conducting state only after all the switch transistors each having a conducting-state resistance greater than the conducting-state resistance of the specific switch transistor have been put in a conducting state."

As described above, a switch transistor or a plurality of unit transistors are controlled to enter the conducting state or the non-conducting state at the same time. In a first switch conduction control operation, a switch transistor having a relatively large conducting-state resistance is put in a conducting state. Thereafter, at least one switch conduction control operation is carried out in order to put the other one or plurality of switch transistors in a conducting state at the same time. In the execution of the first and subsequent switch conduction control operations, in accordance with the rule described above, switch transistors each has different a conducting-state resistance are properly and sequentially selected and put in a turned-on state.

The rule stating: "Any specific one of the switch transistors shall be put in a conducting state only after all the switch transistors each having a conducting-state resistance greater than the conducting-state resistance of the specific switch transistor have been put in a conducting state" is a rule to be applied to switch conduction control operations carried out on switch transistors having conducting-state resistances which are different from each other and is not a rule to be applied to switch conduction control operations carried out on switch transistors having conducting-state resistances which are equal to each other. It is thus allowable to put switch transistors having conducting-state resistances which are equal to each other in a turned-on state consecutively in two or more switch conduction control operations carried out successively.

Where the switch conduction control is executed to put switch transistors in a turned-on state sequentially one transistor after another and there are two or more switch transistors having conducting-state resistances which are equal to each other, first of all, the switch conduction control is executed to put switch transistors included in a group as switch transistors having large conducting-state resistances in a turned-on state in an arbitrary order, then, the switch conduction control is executed to put switch transistors included in a group as switch transistors having small conducting-state resistances in a turned-on state in an order abiding by the rule. In this way, any specific switch transistor having small conducting-state resistance is put in a turned-on state on condition that all the switch transistors each having a conducting-state resistance greater than the conducting-state resistance of the specific switch transistor have been put in a turned-on state.

Each time a conduction control operation is carried out, the resistance between the first and second voltage lines is reduced gradually. The decrease in such resistance increases gradually in the course of the entire conduction control even though some times of consecutive decreases are generated.

When a particular current flows through a particular switch transistor put in a turned-on state as a result of carrying out a conduction control operation, the difference in voltage between the first and second voltage lines decreases so that, when at least one next conduction control operation is carried out in order to put the next switch transistor having the uniform (or smaller) value of conducting-state resistance in a turned-on state, the magnitude of a new current flowing through the next switch transistor is smaller than the magnitude of the particular current. In the course of the entire conduction control, however, the aforementioned decrease in resistance between the first and second voltage lines increases gradually so that the current flows easily in comparison with a configuration in which decreases in such resistance are uniform. As a result, the higher-level voltage of the two voltages appearing on the first and second voltage lines quickly approaches the lower-level voltage of the two voltages.

In accordance with the other embodiment, in order to carry out a voltage equalization process at a high speed in the same way, the switch conduction control section controls a transition of each of the switch transistors from a turned-off state to a turned-on state by turning on the switch transistors at a plurality of switch turning-on time intervals including at least a specific switch turning-on time interval shorter than a switch turning-on time interval preceding the specific switch turning-on time interval.

Typically, the larger the difference in voltage between the first and second voltage lines in initial switch conduction control, the longer the switch turning-on time interval between a switch conduction control operation carried out to put a switch transistor in a turned-on state and a next switch conduction control operation carried out to put another switch transistor in a turned-on state. That is to say, the switch conduction control section controls a transition of each of the switch transistors from a non-conducting state to a conducting state by turning on the switch transistors at a plurality of switch turning-on time intervals so that, in the course of the entire switch conduction control, the switch turning-on time interval is gradually shortened.

In either of the embodiments, in initial conduction control for a large difference in voltage between the first and second voltage lines, some of switch transistors are each controlled to enter a conducting state so that the resistance between the first and second voltage lines does not abruptly decrease. Thus, the maximum magnitude of a current flowing through the first voltage line is small. As a result, it is possible to repress the peak of variations of a voltage appearing on the first voltage line. In addition, in comparison with control to sequentially put switch transistors having a uniform conducting-state resistance at equal turning-on time intervals, the fast voltage equalization process described above reduces the length of time it takes to complete the conduction control operations which are commenced at the start of the switch conduction control.

Each of the embodiments described above executes conduction control on switch transistors connected in parallel between a first voltage line and a second voltage line by gradually increasing the number of aforementioned switch transistors each put in a conductive state. (The transistors having the uniform conducting-state resistance are allowed to be turned on consecutively.) Thus, each of the embodiments offers a merit that it is possible to reduce the length of time it takes to complete a sequence of conduction control operations which are commenced at the start of the switch conduction control while repressing the peak of variations of a voltage appearing on the first voltage line, that is, repressing the peak of power-supply noises.

BRIEF DESCRIPTION OF THE DRAWINGS

FIG. 10 is an explanatory diagram of the other example of the switch control in the embodiment.

DETAILED DESCRIPTION OF THE PREFERRED EMBODIMENT

First Typical Overall Configuration

Figure 1:
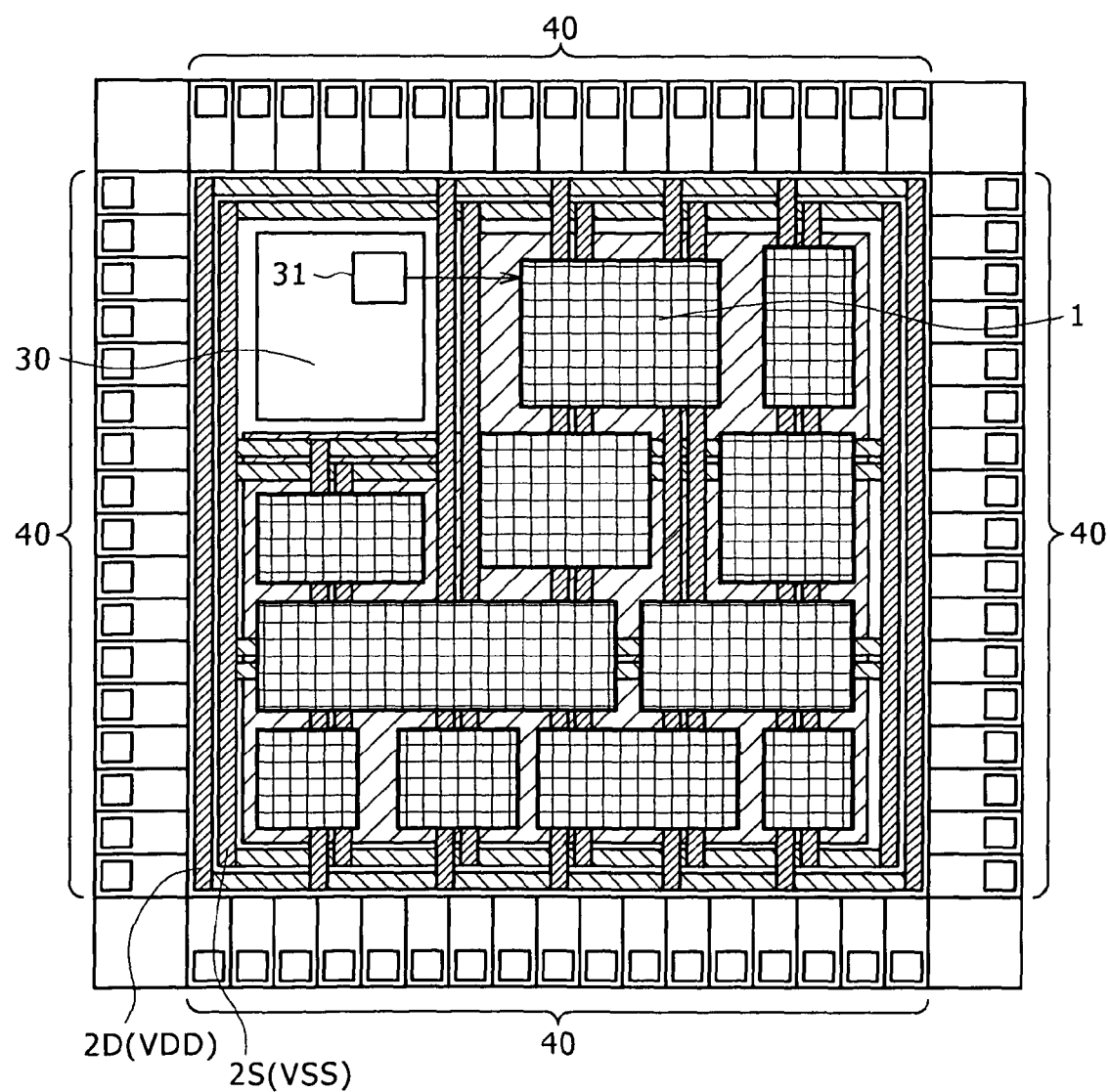
FIG. 1 is a block diagram showing a first typical overall configuration of a semiconductor integrated circuit according to an embodiment of the present invention.

FIG. 1 is a block diagram showing a first typical overall configuration of a semiconductor integrated circuit according to an embodiment of the present invention.

In the configuration shown in FIG. 1, a plurality of input/output cells 40 are arranged to form an array along each of the four sides of a rectangular semiconductor chip in which the semiconductor integrated circuit is created. In a chip area surrounded by the input/output cells 40, a real VDD line 2D and a real VSS line 2S are provided as first voltage lines. To put it in detail, the real-voltage line pairs (2D, 2S) are oriented in the horizontal (row) direction and the vertical (column)

direction so as to form a voltage line layout having the shape of a lattice. In addition, the real-voltage line pairs (2D, 2S) surround each lattice square, forming the external lattice frame of the lattice square. The external lattice frame of a lattice square serves as a number of power-supply points for the lattice square.

The real-voltage line pairs (2D, 2S) oriented in the horizontal (row) direction are created from a metal layer different from a metal layer for creating the real-voltage line pairs (2D, 2S) oriented in the vertical (column) direction, and the metal layers form a multi-layer line structure. In this structure, the real VDD lines 2D and the real VSS lines 2S may cross each other in a state of being electrically insulated from each other.

Each of the lattice squares surrounded by the real-voltage line pairs (2D, 2S) and its external lattice frame form a segment of the chip area. In this segmented and relatively large chip area, a non-MTCMOS applied block (hereinafter referred to as non-applied circuit block) 30 is provided. In the various sizes of segmented chip areas, a number of MTCMOS applied blocks (hereinafter referred to as MTCMOS circuit blocks) are provided. That is to say, each of circuit blocks other than the non-applied circuit block 30 is an MTCMOS circuit block. In the diagram of FIG. 1, one of the MTCMOS circuit blocks is denoted by reference numeral 1.

It is to be noted that, in the diagram of FIG. 1, each of the MTCMOS circuit block 1 and the remaining MTCMOS circuit blocks is connected to the real-voltage line pairs (2D, 2S). On the other hand, the diagram of FIG. 1 shows as if the non-applied circuit block 30 were not connected to the real-voltage line pairs (2D, 2S). In actuality, however, the non-applied circuit block 30 is also connected to the real-voltage line pairs (2D, 2S).

The MTCMOS circuit block 1 includes a plurality of switch transistors. The switch transistors are each provided in an area not occupied by circuit cells each used for implementing a function of the MTCMOS circuit block 1. As an alternative, each of the switch transistors is provided as a circuit cell. If the switch transistor is provided as a circuit cell, the circuit cell may or may not include logic circuits other than the switch transistors. That is to say, the circuit cell may include only the switch transistor.

Figure 2:
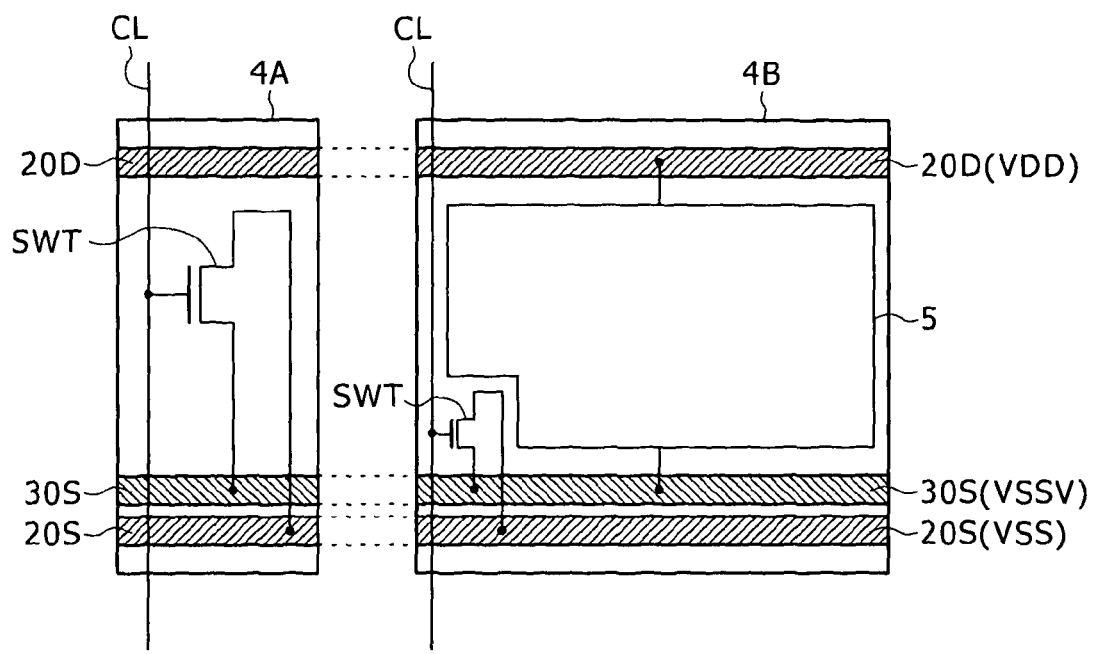
FIG. 2A is a diagram showing a typical internal layout of a circuit cell including a switch transistor SWT.
FIG. 2B is a diagram showing a typical internal layout of another circuit cell including a switch transistor SWT and a logic circuit section 5.

FIGS. 2A and 2B are diagrams each showing a typical internal layout of a circuit cell including a switch transistor. To be more specific, in FIG. 2A, a circuit cell 4A includes a switch transistor SWT as only one of active element whereas a circuit cell 4B includes a switch transistor SWT and a logic circuit section 5 in FIG. 2B.

It is to be noted that, in each of the diagrams of FIGS. 2A and 2B, the switch transistor SWT for controlling the operation to supply and cut off a reference voltage VSS is an NMOS transistor. As shown in each of the diagrams of FIGS. 2A and 2B, each of the circuit cells includes circuit-cell elements which are a branch line 20S, a branch line 20D and a virtual VSS line 30S. The branch line 20S is referred to as a part of the first voltage line whereas the virtual VSS line 30S is referred to as a second voltage line as described below. A reference voltage VSS is asserted on the branch line 20S whereas a power-supply voltage VDD is asserted on the branch line 20D.

Included in the MTCMOS circuit block 1, the branch line 20S is a branch originated from the real VSS line 2S shown in the diagram FIG. 1. Also included in the MTCMOS circuit block 1, the branch line 20D is a branch originated from the real VDD line 2D shown in the diagram FIG. 1 in the same way as the branch line 20S.

On the other hand, the virtual VSS line 30S is peculiar to the MTCMOS circuit block 1. That is to say, the virtual VSS line 30S is provided only inside the MTCMOS circuit block 1. Referred to as the second voltage line, the virtual VSS line 30S performs the role to supply the reference voltage VSS to a logic circuit 5 and other circuits in the circuit cell.

As shown in FIG. 2B, the switch transistor SWT is provided on the side of the reference voltage VSS, that is, between the virtual VSS line 30S as the second voltage line and the branch line 20S as the first voltage line as described above. However, the wiring of the switch transistor SWT is by no means limited to this configuration. For example, the switch transistor SWT can also be provided on the side of the power-supply voltage VDD. In this case, a virtual VDD line (not shown) as the second voltage line for supplying the power-supply voltage VDD to the logic circuit 5 can be newly provided between the branch line 20D as a first voltage line and the logic circuit 5 whereas a PMOS transistor is provided between the virtual VDD line and the branch line 20D to serve as the switch transistor. As an alternative, the switch transistors can be provided both sides of the reference voltage VSS and the power-supply voltage VDD.

In order to make the explanation easy to understand, in the following description, it is assumed that the switch transistor SWT is provided only to the side of the reference voltage VSS.

As shown in FIGS. 2A and 2B, the switch transistor SWT is connected between the branch line 20S and the virtual VSS line 30S, and the logic circuit 5 is connected between the branch line 20D and the virtual VSS line 30S.

It is to be noted that elements inside the circuit cell are connected to each other by properly placing the circuit cell. That is to say, it is not always necessary to create wires for connecting the elements to each other. The circuit cells are connected to each other by making use of wires on an upper layer.

The switch transistor SWT is connected to a control line CL on the upper layer.

Typically, as many control lines CL as switch transistors SWT are provided for the MTCMOS circuit block 1. As an alternative, one control line CL is provided for a predetermined plurality of switch transistors SWT.

The control line CL is connected to a switch control section 31 serving as the switch conduction control section employed in the non-applied circuit block 30 shown in the diagram of FIG. 1 to serve as the switch conduction control section mentioned before. The switch control section 31 controls an operation to put the switch transistor SWT in a turned-on (conducting) state or a turned-off (non-conducting) state through the control line CL. Since the switch control section 31 is employed in the non-applied circuit block 30, the switch control section 31 receives the power-supply voltage VDD and the reference voltage VSS to operate at normal times after the semiconductor integrated circuit in question is activated.

Figure 3:
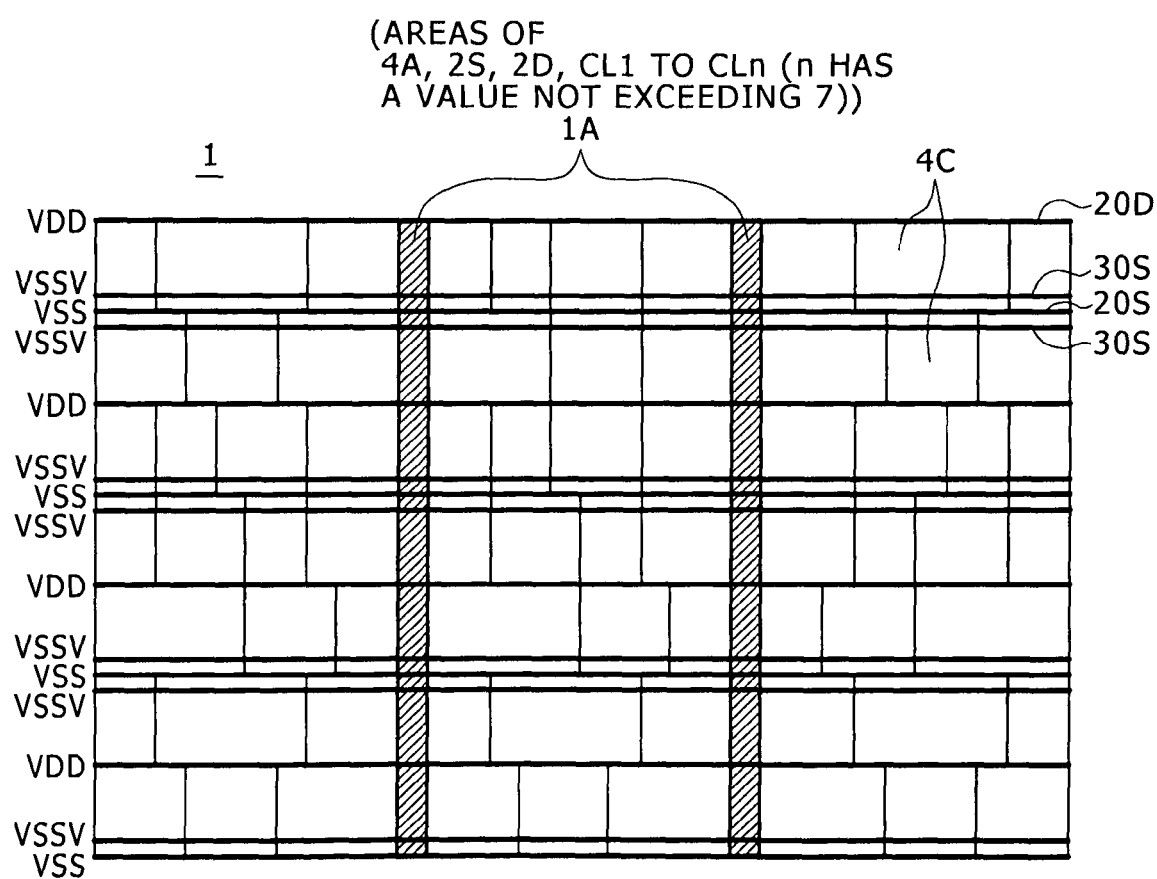
FIG. 3 is a diagram showing a typical array of aforementioned circuit cell shown in FIG. 2A, in the first typical overall configuration shown in FIG. 1.

FIG. 3 is a diagram showing a typical array of aforementioned circuit cells 4A each shown in FIG. 2A.

In the typical array shown in FIG. 3, seven circuit cells 4A each shown in the diagram of FIG. 2A are arranged in the column direction. An area in which the circuit cells 4A are arranged is referred to as a switch layout area 1A.

In the diagram of FIG. 3, a circuit cell 4C includes the logic circuit 5, the branch line 20S, the branch line 20D and the virtual VSS line 30S. Thus, the circuit cell 4C is a circuit cell obtained as a result of removing the switch transistor SWT and the control line CL from the circuit cell 4B shown in FIG. 2B. The circuit cells 4C are arranged in the row direction to form a cell line on a row. FIG. 3 shows seven cell lines each provided on a row.

Two adjacent cell lines provided on two rows separated away from each other in the column direction perpendicular to the row direction share a branch line 20S and a branch line 20D.

On the upper layer of a multi-layer wiring structure of the circuit cells 4A in the switch layout area 1A, on the other hand, up to seven control lines CL1 to CLn as well as the real VDD line 2D and the real VSS line 2S which are shown in the diagram of FIG. 1 are laid out by well utilizing the multi-layer wiring structure.

It is to be noted that the layout of the switch transistors SWT does not have to be oriented in the column direction shown in FIG. 3. For example, the layout of the switch transistors SWT can be oriented in the row direction. In this case, circuit cells 4A shown in the diagram of FIG. 2A or circuit cells 4B shown in the diagram of FIG. 2B are laid out in the row direction so that the layout of the switch transistors SWT is oriented in the row direction automatically. Then, a plurality of aforementioned control lines CL each connected to the gate electrode of one of the switch transistors SWT are oriented in the row or column direction.

Second Typical Overall Configuration

Figure 4:
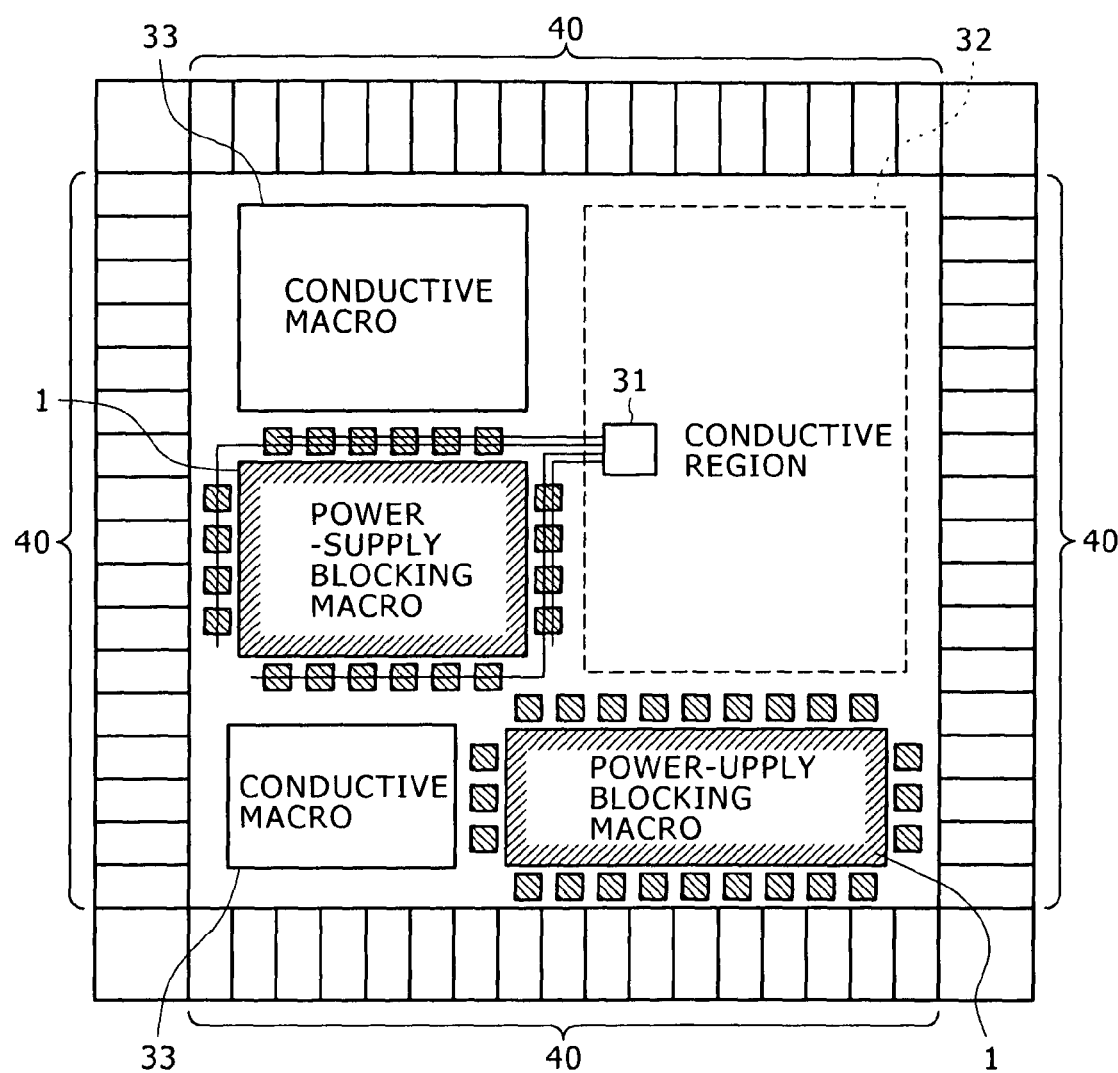
FIG. 4 is a block diagram showing a second typical overall configuration of a semiconductor integrated circuit according to the embodiment of the present invention.

FIG. 4 is a block diagram showing a second typical overall configuration of the semiconductor integrated circuit according to the embodiment of the present invention.

In the configuration shown in FIG. 4, a plurality of input/output cells 40 are arranged to form an array along each of the four sides of a rectangular semiconductor chip in which the semiconductor integrated circuit is created. In a chip area surrounded by the input/output cells 40, a real VDD line 2D and a real VSS line 2S which are not shown in the block diagram of FIG. 4 are provided to form a real-voltage line pair serving as first voltage lines. To put it in detail, each of the real-voltage line pairs (2D, 2S) is a pair of parallel real power supply lines 2D and 2S oriented in the horizontal (row) direction and the vertical (column) direction so as to form a voltage line layout having the shape of a lattice.

In the chip area of the circuit layout shown in FIG. 4, some circuit blocks are provided. In the typical configuration shown in the block diagram of FIG. 4, a circuit block 32 referred to as a conduction area is provided in the chip area. The circuit block 32 has basic components of a semiconductor integrated circuit. The basic components include a CPU, a register, a memory and a power-supply circuit. The circuit block 32 corresponds to the non-applied circuit block 30 in FIG. 1. The circuit block 32 receives the power-supply voltage VDD and the reference voltage VSS to operate at normal times after the semiconductor integrated circuit including the circuit block 32 is activated.

In addition to the circuit block 32, in the chip area of the circuit layout shown in FIG. 4, a number of circuit blocks each referred to as a macro are provided. Each of the macro circuit blocks has a function of a logic circuit useful for the semiconductor integrated circuit.

The macro circuit blocks are classified into two large categories, i.e., non-applied circuit blocks 33 and MTCMOS circuit blocks 1. Much like the circuit block 32, each of the non-applied circuit blocks 33 receives the power-supply voltage VDD and the reference voltage VSS to operate at normal times after the semiconductor integrated circuit including the macro circuit blocks is activated. In the typical configuration shown in the block diagram of FIG. 4, each of the non-applied circuit blocks 33 is referred to as a conductive macro whereas each of the MTCMOS circuit blocks 1 is referred to as a power-supply blocking macro. As described before, a non-applied circuit block is a circuit block to which the MTCMOS technology is not applied.

Figure 5:
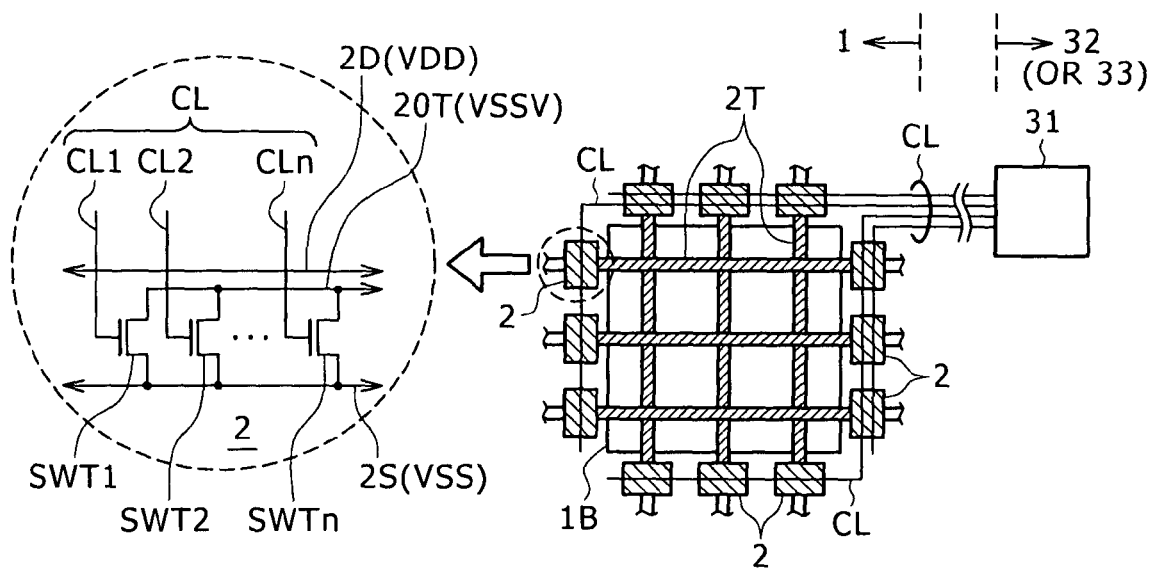
FIG. 5 is a diagram showing the locations of the real power-supply line pair and the switch transistors in the second typical overall configuration shown in FIG. 4.

FIG. 5 is a diagram showing the locations of the real power-supply line pair (2D, 2S) and the switch transistors SWT in the MTCMOS circuit block 1.

In FIG. 5, reference numeral 1B denotes a functional circuit cell layout area (hereinafter referred to as cell layout area) of the MTCMOS circuit block 1. For example, in the cell layout area 1B, circuit cells each obtained as a result of removing the switch transistor SWT and the control line CL from the circuit cell 4B shown in FIG. 2B are laid out in the row and column directions.

Power is supplied to the circuit cells through wires typically having the same branch structure as that shown in FIG. 3.

In FIG. 5, only trunk lines of the branch structure are shown. To put it concretely, in the cell layout area 1B shown in FIG. 5, hatched wires forming a lattice shape represent trunk lines of the virtual VSS line 20T and a real power-line pair (2D, 2S). In the following description, the hatched wires are referred to as a trunk-line group 2T.

The trunk-line group 2T is extended to the outside of the cell layout area 1B and connected to other conductive macros such as the non-applied circuit blocks 33 in FIG. 4 to supply power thereto. At two locations of the external extensions existing outside the cell layout area 1B as extensions of the trunk-line group 2T, switch blocks 2 are provided. To put it in detail, at two locations of the row-direction external extension, switch blocks 2 are provided and, in the same way as the row-direction external extension, at two locations of the column-direction external extension, other switch blocks 2 are provided.

A diagram on the left side of FIG. 5 shows an enlarged switch block 2, in which a virtual VSS line 20T, a real VDD line 2D and a real VSS line 2S are provided in the switch block 2. The real VSS line 2S and the real VDD line 2D are further extended to the outside of the switch block 2 and connected to other conductive macros such as the non-applied circuit blocks 33 in the semiconductor integrated circuit shown in FIG. 4 to supply power thereto.

The switch block 2 employs n switch transistors SWT1 to SWTn connected in parallel between the virtual VSS line 20T and the real VSS line 2S. The gate of the switch transistor SWTm is connected to a control line CLm where $1 \leq m \leq n$. It is to be noted that, in accordance with a control method to be described later, the gates of a plurality of switch transistors SWT may be connected to a control line CL in some cases.

The control lines CL consisting of the control lines CL1 to CLn are connected to the switch control section 31 employed in the circuit block 32 as shown in FIG. 4.

<First Basic Concept of Switch Control>

Figure 6A:
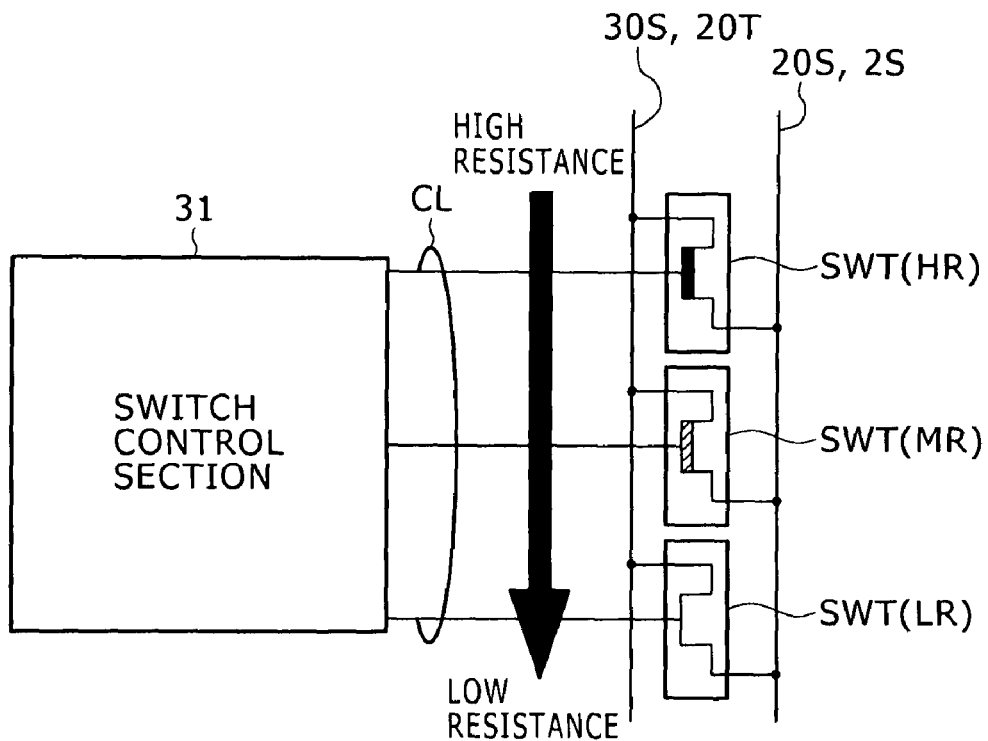
FIGS. 6A and 6B are explanatory diagrams showing a first basic concept of a switch control in the embodiment.
Figure 6B:
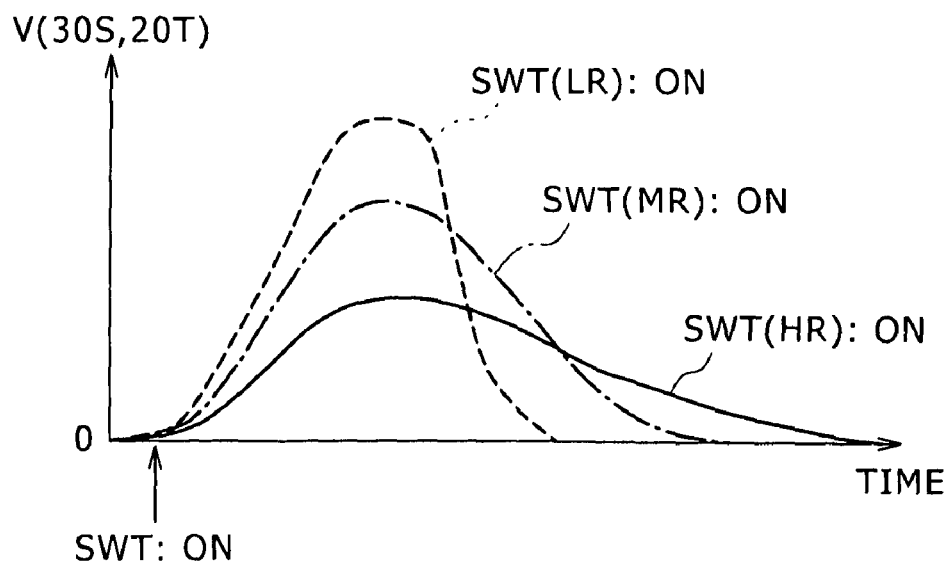

FIGS. 6A and 6B are explanatory diagrams referred to in description of a first basic concept of switch control. As shown in FIG. 6A, a plurality of switch transistors SWT used in the first basic concept includes a plurality of transistors having different conducting-state resistances from each other. Typically, the switch transistors SWT are the switch transistor SWT shown in FIG. 2 or the switch transistors SWT1 to SWTn shown in FIG. 5. In the typical configuration shown in FIG. 6A, the switch transistors SWT are HR (high resistance), MR (medium resistance) and LR (low resistance) switch transistors SWT. The HR switch transistor SWT has the largest conducting-state resistance among all the switch transistors SWT whereas the LR switch transistor SWT has the smallest conducting-state resistance among all the switch transistors SWT. The MR switch transistor SWT has a middle conducting-state resistance between the largest and smallest conducting-state resistances. However, in accordance with the present invention, at least two switch transistors SWT having conducting-state resistances which are different from each other are required and four or more switch transistors SWT having conducting-state resistances can also be used. That is to say, the number of types of switch transistors SWT (type represents variety of conducting-state resistances) can be any integer as long as the integer is at least 2. In addition, the total number of transistors can be any integer as long as the integer is at least 2. The number of types of switch transistors SWT and the total number of transistors can be the same integer; however, the number of types of switch transistors SWT is required be smaller than the total number of transistors. Some of consecutive transistors can have the uniform conducting-state resistances.

In FIG. 6A, the source of each of the HR (high resistance) switch transistor SWT, the MR (medium resistance) switch transistor SWT and the LR (low resistance) switch transistor SWT is connected to the common real VSS line 2S or the branch line 20S of the real VSS line 2S whereas the drain of each of those switch transistors SWT is connected to the common virtual VSS line which is the virtual VSS line 20T shown in FIG. 5 or the virtual VSS line 30S shown in FIG. 3. The gate of each of those switch transistors SWT is connected through a control line CL to a switch control section 31.

A difference in electric potential between the branch line 20S of the real VSS line 2S as the first voltage line and the virtual VSS line 30S as the second voltage line or a difference in electric potential between the real VSS line 2S as the first voltage line and the virtual VSS line 20T as the second voltage line is initially fixed and, then, from a certain point of time, the HR (high resistance) switch transistor SWT, the MR (medium resistance) switch transistor SWT and the LR (low resistance) switch transistor SWT are put in a turned-on state at three separate times respectively. In this case, the changes of an electric potential V (30S, 20T) appearing on the virtual VSS line 30S or the virtual VSS line 20T for the three switch transistor SWT turning-on operations are shown as three curves respectively in FIG. 6B. In the following description, the electric potential is referred to as a virtual VSS-line electric potential V (30S, 20T).

As shown in FIG. 6B, the larger the conducting-state resistance, the smaller the virtual VSS-line electric potential V (30S, 20T). That is to say, even though there is an effect of repressing power-supply noises, the larger the conducting-state resistance, the longer the time it takes to complete an electrical discharging process.

This first basic concept carries out an operation to equalize the voltages appearing on the first and second voltage lines through a plural times of controls to put switch transistors SWT in a conducting state by use of, when the difference in electric potential between the first and second voltage lines is large, the switch transistor SWT having a large conducting-state resistance, on the other hand, when the difference in electric potential between the first and second voltage lines is small, the switch transistor SWT having a small conducting-state resistance.

To put it concretely, the switch control section 31 controls a transition of each of the switch transistors SWT from a non-conducting state to a conducting state by turning on the switch transistors SWT at separate points of time while abiding by a rule stating: "Any specific one of the switch transistors SWT shall be put in a conducting state only after all the switch transistors SWT each having a conducting-state resistance greater than the conducting-state resistance of the specific switch transistor SWT have been put in a conducting state."

The above rule prescribes control of an operation to change switch transistors SWT having conducting-state resistances which are different from each other from a non-conducting state to a conducting state by turning on the switch transistors SWT at separate points of time. The rule does not prescribe control of an operation to change switch transistors SWT having conducting-state resistances which are equal to each other from a non-conducting state to a conducting state. Thus, it is allowable to change switch transistors SWT having conducting-state resistances which are equal to each other from a non-conducting state to a conducting state at two or more successive points of time.

For example, where the switch transistors SWT are controlled one by one to put in a conducting state, if there are two or more switch transistors SWT having the uniform conducting-state resistance, the switch transistors SWT having the uniform specific conducting-state resistance which are greater than the others can be put in a turned on state sequentially in any arbitrary order in the uniform resistance group. When switch transistors SWT included in another group as the switch transistors SWT having conducting-state resistances lower than the conducting-state resistance of the switch transistor SWT pertaining to the specific group is put in a turned on state, it is necessary to abide by the rule described above. That is to say, any specific one of the switch transistors SWT shall be put in a conducing state only after all the switch transistors SWT each having a conducting-state resistance greater than the conducting-state resistance of the specific switch transistor SWT have been put in a turned on state. A typical example of the control will be described later.

The resistance between the first and second voltage lines is gradually reduced by a resistance decrease every time a conduction control is carried out to put a switch transistor SWT in a turned-on state. In this case, the first and second voltage lines are either the real VSS line 2S and the virtual VSS line 20T respectively or the branch line 20S and the virtual VSS line 30S respectively. In the course of the process to reduce the resistance, the resistance decreases may be equal to each other for some switch conduction control operations which are carried out consecutively. Nevertheless, in the whole process to reduce the resistance, the resistance decrease is gradually increasing.

In each of the conduction control, a current flows through the switch transistor SWT so that the difference in electric potential between the first and second voltage lines decreases. Thus, in the next conduction control, at least one next switch transistor SWT having a conducting-state resistance equal to (or smaller than) the conducting-state resistance of the present switch transistor SWT put in a turned-on state in the present conduction control is put in a turned-on state but the magnitude of a current flowing through the next switch transistor SWT is smaller than the magnitude of a current flowing through the present switch transistor SWT. In the whole process, however, the resistance decrease is gradually increasing. Thus, currents flow more immediately than a case in which the resistance decrease is fixed. As a result, the high-level voltage appearing on either the first or second voltage line immediately drops, approaching the low-level voltage appearing on either the second or first voltage line. This drop is obvious from the fact that the use of a switch transistor SWT having a small conducting-state resistance reduces the length of time for completing discharge as shown in FIG. 6B.

Each of the HR (high resistance) switch transistor SWT, the MR (medium resistance) switch transistor SWT and the LR (low resistance) switch transistor SWT which are shown in FIG. 6A can be a single transistor or a set of a plurality of unit transistors. If each of those switch transistors SWT is a set of a plurality of unit transistors, the unit transistors included in any one of the switch transistors SWT are controlled simultaneously to enter a turned-on or turned-off state at the same time. For this reason, the unit transistors composing any one of the switch transistors SWT can be conceptually regarded as one transistor.

If the unit transistors have a uniform conducting-state resistance, the high, middle or low conducting-state resistance of a switch transistor SWT is determined by the number of unit transistors composing the switch transistor SWT. To be more specific, the higher the number of unit transistors included in a switch transistor SWT as unit transistors to be controlled simultaneously to enter a turned-on or turned-off state, the lower the conducting-state resistance. It is to be noted, however, that also in this case, it is necessary to abide by the rule described above and it is allowable to configure any specific one of switch transistors SWT to include as many unit transistors as unit transistors composing a switch transistor SWT to be put in a turned-on state immediately before or after the specific switch transistor SWT.

A typical configuration including switch transistors SWT each having a plurality of unit transistors to serve as one of the switch transistors SWT shown in FIG. 6A will be described later in detail.

<Second Basic Concept of Switch Control>

Figure 7A:
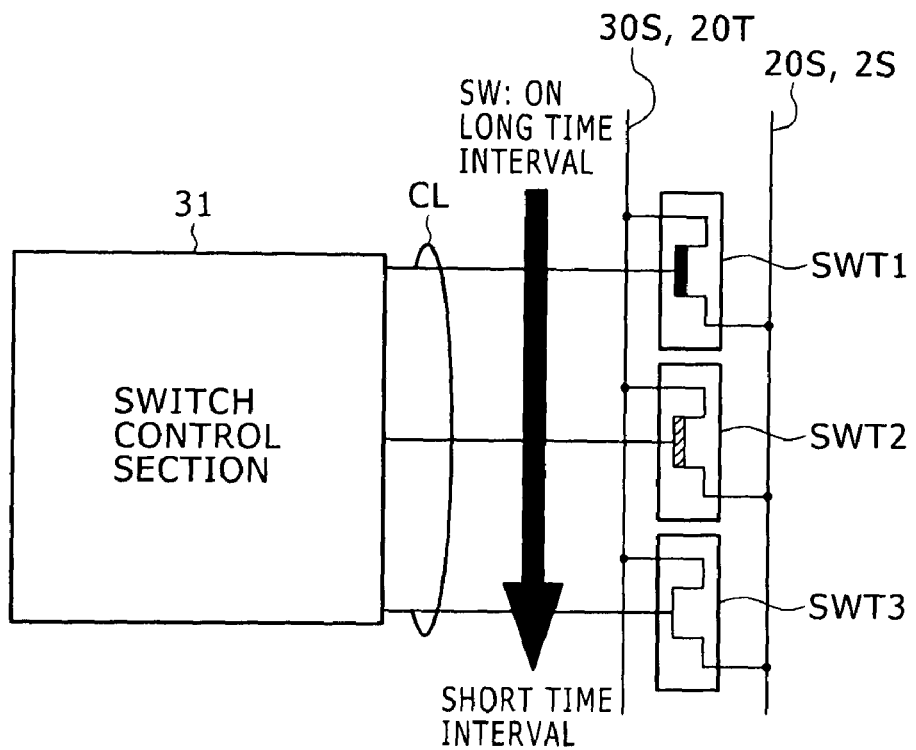
FIGS. 7A and 7B are explanatory diagrams showing a second basic concept of the switch control in the embodiment.
Figure 7B:
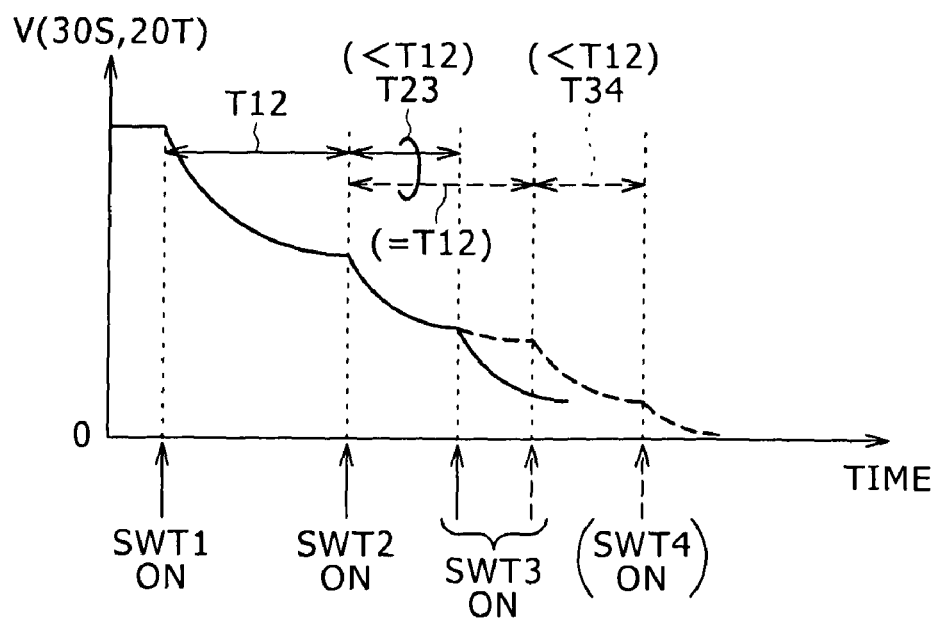

FIGS. 7A and 7B are explanatory diagrams of a second basic concept of switch control.

As shown in FIG. 7A, a plurality of switch transistors SWT have a uniform conducting-state resistance and are to be put in a conducting state at gradually shorter switch turning-on time intervals in the whole switch conduction control to reduce the resistance between the first and second voltage lines in accordance with the second basic concept. Typically, the switch transistors SWT are the switch transistor SWT shown in the diagrams of FIG. 2 or the switch transistors SWT1 to SWTn shown in the diagram of FIG. 5. The phrase stating: "gradually shorter time intervals in the whole process" also has an implication that two or more consecutive intervals at which switch transistors SWT are put in a turned-on state have lengths equal to each other. However, it means that, at least, the switch turning-on time interval between the first and next switch transistors SWT shall be longer than the switch turning-on time interval between the last and immediately before the last switch transistors SWT. In other words, the switch conduction control based on the second basic concept is characterized in that the switch control section 31 executes switch conduction control to carry out switch conduction control operations to sequentially put a plurality of switch transistors SWT in a turned-on state at a plurality of switch turning-on time intervals including at least an earlier switch turning-on time interval and a later switch turning-on time interval with a length shorter than the length of the earlier switch turning-on time interval.

In the case of the diagram of FIG. 7A, only the switch transistors SWT1 to SWT3 are shown. It is to be noted, however, the present invention is not limited to this configuration. That is to say, the number of switch transistors SWT can be any integer as long as the integer is at least equal to 2.

FIG. 7B shows a relation between the change of the virtual VSS-line electric potential V (30S, 20T) and the lapse of time. In FIG. 7B, a solid line represents the case in which the number of switch transistors SWT is 3 whereas a dashed line represents the case in which the number of switch transistors SWT is 4.

In the case in which the number of switch transistors SWT is 3, a switch turning-on time interval T23 between an operation to put the switch transistor SWT2 in a turned-on state and an operation to put the switch transistor SWT3 in a turned-on state is deliberately made shorter than a switch turning-on time interval T12 between an operation to put the switch transistor SWT1 in a turned-on state and an operation to put the switch transistor SWT2 in a turned-on state.

In the same way as the case in which the number of switch transistors SWT is 3, in the case in which the number of switch transistors SWT is 4, the switch turning-on time interval between consecutive operations to put switch transistors SWT can be sequentially made shorter. In the typical case represented by the dashed line shown in FIG. 7B, however, the switch turning-on time interval T23 between an operation to put the switch transistor SWT2 in a turned-on state and an operation to put the switch transistor SWT3 in a turned-on state is made equal to the switch turning-on time interval T12 between an operation to put the switch transistor SWT1 in a turned-on state and an operation to put the switch transistor SWT2 in a turned-on state whereas a switch turning-on time interval T34 between an operation to put the switch transistor SWT3 in a turned-on state and an operation to put the switch transistor SWT4 in a turned-on state is made shorter than the switch turning-on time interval T12 which is equal to the switch turning-on time interval T23.

In an initial state of the conduction control, the difference in electric potential between the first and second voltage lines is large. In this case, the first and second voltage lines are either the real VSS line 2S and the virtual VSS line 20T respectively or the branch line 20S and the virtual VSS line 30S respectively. In this initial state, it takes time to stabilize the difference in electric potential between the first and second voltage lines from a state of instability generated at the start of the switch conduction control. Thus, in accordance with the second basic concept, in this initial state, the switch turning-on time interval is deliberately made long. When another switch transistor SWT is put in a turned-on state after the first switch transistor SWT has been once put in a turned-on state, on the other hand, the time it takes to stabilize the difference in electric potential between the first and second voltage lines is relatively short because the total conducting-state resistance between the first and second voltage lines has become smaller.

In accordance with the second basic concept paying attention to the fact that the time it takes to stabilize the difference in electric potential between the first and second voltage lines is becomes short as described above, the switch control section 31 executes conduction control to sequentially put a plurality switch transistors SWT in a turned-on state at a plurality of switch turning-on time intervals including at least an earlier switch turning-on time interval and a later switch turning-on time interval with a length shorter than the length of the earlier switch turning-on time interval.

In the case of this embodiment, however, the switch control section 31 needs only to execute switch conduction control to sequentially put a plurality switch transistors SWT in a turned-on state at a plurality of switch turning-on time intervals including at least an earlier switch turning-on time interval and a later switch turning-on time interval with a length shorter than the length of the earlier switch turning-on time interval. The switch control section 31 is by no means required to wait for the difference in electric potential to get stabilized prior to execution of each of the switch conduction control operations. Nevertheless, it is desirable to set a prerequisite requiring that the switch control section 31 shall wait for the difference in electric potential to get stabilized prior to execution of each of the switch conduction control operations. This is because, by setting such a prerequisite, it is easy to estimate an electric potential appearing at a switch-on time and, hence, it is easy to design the plurality of switch conduction control. Nevertheless, the present invention is not restricted by the prerequisite.

As explained above, in an initial state of the conduction control, the difference in electric potential between the first and second voltage lines is large. Thus, in accordance with the first and second basic concepts described above, only some of a plurality of switch transistors SWT are each put in a turned-on state in the initial state. As a result, the resistance between the first and second voltage lines does not drop abruptly so that the maximum value of the magnitude of a current flowing through the first voltage line is small. As a result, it is possible to repress the peak of variations of a voltage appearing on the first voltage line. In addition, in comparison with control to sequentially put switch transistors SWT having a uniform conducting-state resistance at equal switch turning-on time intervals, the fast voltage equalization process described above reduces the length of time it takes to complete the conduction control operations which are commenced at the start of the switch conduction control.

The first and second basic concepts described above can be adopted separately from each other or applied at the same time as a combination of methods.

<Typical Switch Control>

The following description explains typical concrete control as an example of applying the first and second basic concepts at the same time.

Figure 8:
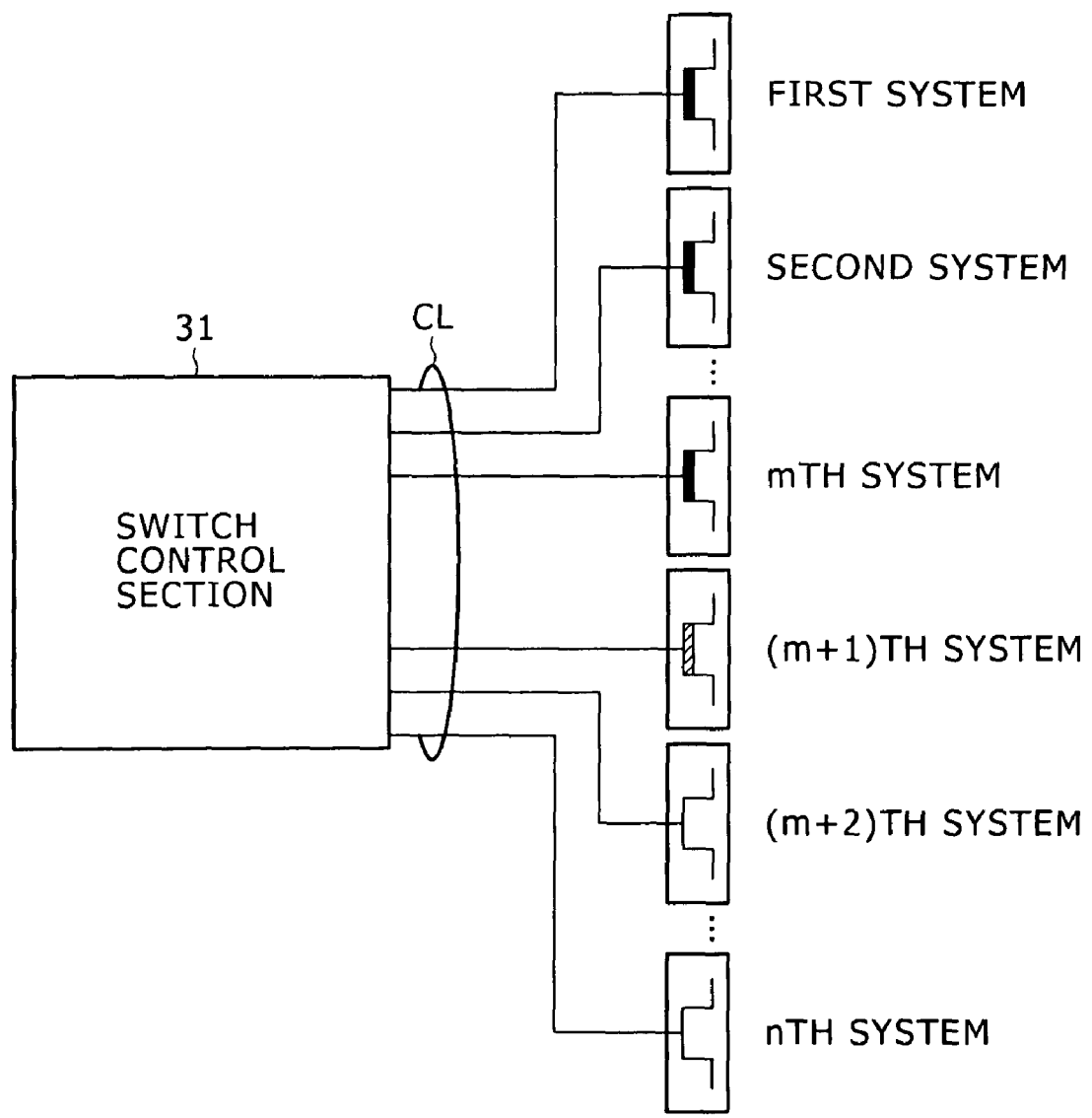
FIG. 8 is an explanatory diagram of a typical example of the switch control in the embodiment.

FIG. 8 is an explanatory diagram referred to in description of a typical example of the switch control.

The technical term 'system' used in the following description of the typical concrete control with reference to the diagram of FIG. 8 means a single switch transistor SWT or a group of switch transistors SWT. The single switch transistor SWT included in a system or the switch transistors SWT included in a system are put in a turned-on state at the same time. Much like the diagram of FIG. 6A, in the diagram of FIG. 8, each HR (high resistance) switch transistor SWT is shown as a transistor circuit-symbol with a black channel, each MR (medium resistance) switch transistor SWT is shown as a transistor circuit-symbol with a hatched channel whereas each LR (low resistance) switch transistor SWT is shown as a transistor circuit-symbol with a channel like a line segment, that is, a transistor circuit-symbol with neither black channel nor hatched channel.

In the diagram of FIG. 8, each of the first to mth systems is an HR (high resistance) switch transistor SWT whereas the (m+1)th system is an MR (medium resistance) switch transistor SWT. Each of the (m+2)th to nth systems is an LR (low resistance) switch transistor SWT. It is to be noted that the configuration of the systems can be changed arbitrarily to a different configuration reflecting other system counts each representing the number of systems each including switch transistors SWT having a uniform conducting-state resistance. For example, it is possible to provide a system configuration in which, conversely, a plurality of systems each include an MR (medium resistance) switch transistor SWT whereas only one system includes an HR (high resistance) switch transistor SWT and only one system includes an LR (low resistance) switch transistor SWT.

Numbers each assigned to a system starts with 1 and, the larger the number assigned to a system, the later the operation carried out to put a switch transistor SWT included in the system, to which the number is assigned, in turned-on state. The switch control section 31 is configured to include hardware, software or both hardware and software as means capable of executing a sequence of operations to sequentially activate control lines CL connected to the systems in order to put the switch transistors SWT included in the systems in a turned-on state in system units.

As a technique for setting the conducting-state resistance of a switch transistor SWT, it is possible to adopt a technique for setting the channel concentration of the transistor SWT in a manufacturing process of the transistor. In this embodiment, however, the gate width of a switch transistor SWT is determined in a manufacturing process of the transistor SWT in order to set the conducting-state resistance of the transistor SWT.

The larger the gate width of a switch transistor SWT, the smaller the conducting-state resistance of the transistor SWT. In the work of designing a switch transistor SWT as a cell including unit transistors connected to each other in parallel, it is desirable to adopt a method for setting the effective gate width of the cell by determining the number of aforementioned unit transistors each used as a basic unit having a small gate width.

If the desirable method described above is adopted, for example, an HR (high resistance) switch transistor SWT does not have to be a single switch transistor SWT having a conducting-state resistance determined in advance. Instead, the HR (high resistance) switch transistor SWT can be a switch transistor cell including a plurality of unit transistors connected to each other in parallel and a process to set the conducting-state resistance of the HR (high resistance) switch transistor SWT can be controlled in detail by determining the number of aforementioned unit transistors. Of course, it is also possible to assign a conducting-state resistance determined in advance to each of the HR (high resistance) switch transistor SWT, the MR (medium resistance) switch transistor SWT and the LR (low resistance) switch transistor SWT.

Without regard to whether a switch transistor SWT composing each of the first to nth systems shown in FIG. 8 is a single switch transistor SWT or a switch transistor cell employing a plurality of unit transistors, in the entire configuration, the larger the number assigned to a particular system, the larger the decrease of the conducting-state resistance. In a group of systems including switch transistors SWT having a uniform conducting-state resistance, the consecutive equal decreases of the conducting-state resistance is allowed.

With the scheme described above, in the entire configuration, the larger the number assigned to a system, the larger the voltage drop obtained as a result of applying the same voltage between the source and drain of the switch transistor SWT in each of the systems for the same period of time.

Figure 9A:
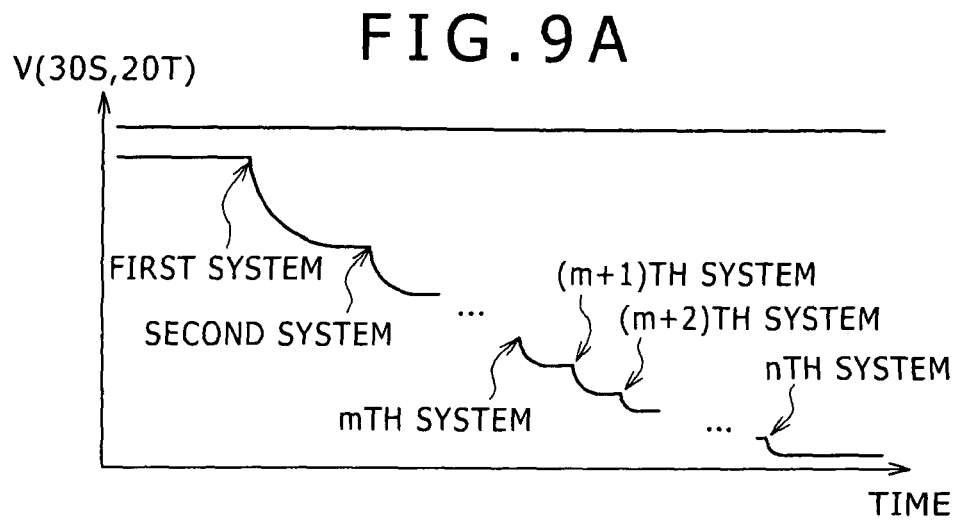
FIGS. 9A and 9B are model diagrams each shows a relation between a voltage appearing on a first voltage line and the lapse of time of the typical example of the switch control.
Figure 9B:
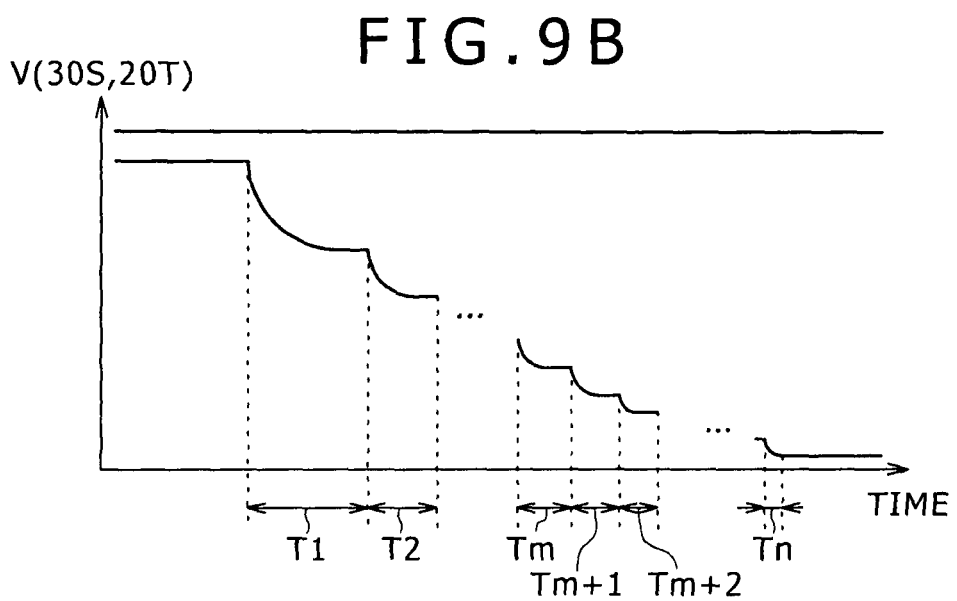

FIGS. 9A and 9B are diagrams showing curves each representing a relation between a voltage appearing on a virtual VSS line 30S or a virtual VSS line 20T and the lapse of time as a result of conduction control executed by the switch control section 31 and showing timing charts. FIG. 9A is a diagram showing timings with which systems are activated. FIG. 9B shows the diagram in FIG. 9A, which is redrawn by focusing on the lapse of time indicating switch turning-on time intervals.

The switch control section 31 executes switch control as shown in FIGS. 9A and 9B in an initial state in order to drive the MTCMOS circuit block 1, which is shown in the diagrams of FIGS. 1 to 5 to serve as the subject of control, to recover from a power-supply cut-off state.

To put it concretely, in accordance with a recovery command issued by a section such as a CPU, first of all, the switch control section 31 activates a control line CL connected to the first system in order to put an HR (high resistance) switch transistor SWT pertaining to the first system in a turned-on state. This is because the HR (high resistance) switch transistor SWT pertaining to the first system has a large conducting-state resistance and, by putting the HR (high resistance) switch transistor SWT in a turned-on state, power-supply noises can be repressed.

A state prior to a first conduction control is a power-supply cut-off state and, if the power-supply cut-off state lasts long, the virtual VSS line 30S or the virtual VSS line 20T is electrically charged with a large leak current flowing through a circuit cell employing a transistor having a small threshold voltage. Thus, an electric potential appearing on the virtual VSS line 30S or the virtual VSS line 20T increases to a level close to the power-supply voltage VDD as shown in FIGS. 9A and 9B.

In this state, when the first switch conduction control operation is carried out, the electric potential appearing on the virtual VSS line 30S or the virtual VSS line 20T decreases by a voltage drop. The first switch conduction control operation is an operation started with a timing denoted by reference phrase 'First system' in FIG. 9A. The voltage drop is largest among all voltage drops due to a large voltage applied between the source and gain electrodes of the HR (high resistance) switch transistor SWT pertaining to the first system. Since the conducting-state resistance of the HR (high resistance) switch transistor SWT is also relatively large, however, a sharp voltage drop is repressed. Thus, power-supply noises can also be repressed effectively. With the lapse of time, the electric potential appearing on the virtual VSS line 30S or the virtual VSS line 20T is converged to a fixed level determined by the large conducting-state resistance of the HR (high resistance) switch transistor SWT pertaining to the first system.

As the electric potential appearing on the virtual VSS line 30S or the virtual VSS line 20T has been settled at the fixed level, next, the second system including a HR (high resistance) switch transistor SWT having a conducting-state resistance equal to or slightly smaller than the conducting-state resistance of the HR (high resistance) switch transistor SWT included in the first system is activated by carrying out a second switch conduction control operation. The second switch conduction control operation is an operation started with a timing denoted by reference phrase 'Second system' in the model diagram of FIG. 9A. In the second conduction control, the voltage applied between the source and gain of the HR (high resistance) switch transistor SWT pertaining to the second system prior to the second switch conduction control operation is low in comparison with the voltage applied between the source and gain electrodes of the HR (high resistance) switch transistor SWT pertaining to the first system prior to the first switch conduction control operation. Thus, even though the HR (high resistance) switch transistor SWT pertaining to the second system has a conducting-state resistance slightly smaller than the conducting-state resistance of the HR (high resistance) switch transistor SWT pertaining to the first system, the voltage drop occurring in the second switch conduction control operation can be repressed to a voltage decrease smaller than that of the first switch conduction control operation. As a result, power-supply noises generated in the second switch conduction control operation can also be repressed effectively.

Thereafter, a switch conduction control operation is carried out on each of the third to mth systems each including an HR (high-resistance) switch transistor SWT having a large conducting-state resistance in the same way as the first and second systems.

Then, a control line CL connected to an MR (medium resistance) switch transistor SWT pertaining to the (m+1)th system is activated. The (m+1)th conduction control operation starts with a timing denoted by reference phrase '(m+1)th system' in FIG. 9A.

Subsequently, a control line CL connected to an LR (low resistance) switch transistor SWT pertaining to the (m+2)th system is activated. The (m+2)th conduction control starts with a timing denoted by reference phrase '(m+2)th system' in FIG. 9A.

Thereafter, the operation to activate a control line CL is carried out repeatedly in the same way as the systems described so far till the nth switch conduction control operation is carried out on the last nth system.

As shown in FIG. 9A, by carrying out a sequence of conduction control operations with a plurality of different timings each assigned to one of the operations in the way explained above, it is possible to execute control for gradually reducing the magnitude of the voltage drop described above. Thus, power-supply noises that would otherwise remain after the first switch conduction control operation carried out on the first system no longer appear in the subsequent switch conduction control operations each carried out on one of the remaining systems. The conducting-state resistance of the HR (high resistance) switch transistor SWT pertaining the first system is set at a value that prevents the peak of power-supply noises generated during the first switch conduction control operation from exceeding a reference determined in advance. It is thus possible to effectively prevent generation of power-supply noises affecting delay characteristics through the real VSS line 2S for a non-MTCMOS applied circuit cell included in the same circuit block or another circuit block.

By way of experiment, it is assumed that the switch turning-on time interval between the start of a switch conduction control operation carried out on any particular system and the start of a switch conduction control operation carried out on a system activated after the particular system is made uniform for any two consecutive systems. Even for such a configuration, in accordance with this embodiment, as a whole, switch transistors SWT each used in a system are sequentially selected and put in a turned-on state in an order starting with a switch transistor SWT having the largest conducting-state resistance among the switch transistors SWT and continuing sequentially to switch transistors SWT each having a conducting-state resistance smaller than the conducting-state resistance of a switch transistor SWT selected and put in a turned-on state immediately before so that it is possible to reduce the length of time it takes to complete a sequence of switch conduction control operations which are commenced at the start of the switch conduction control in comparison with a configuration employing only switch transistors SWT each having a large conducting-state resistance for repressing the peak of power-supply noises generated initially.

In order to further reduce the length of time, the control is executed to gradually reduce the switch turning-on time interval as a whole, as shown in FIG. 9B.

To put it concretely, the switch turning-on time intervals T between the starts of the systems satisfy the inequality expression $T1 \geqq T2 \geqq \ldots \geqq Tm \geqq Tm+1 \geqq Tm+2 \geqq \ldots \geqq Tn-1$ where reference notation Ti denotes the switch turning-on time interval between the starts of the ith system and the (i+1)th system. The inequality expression indicates that the switch turning-on time interval Ti+1 may be set at a value equal to the switch turning-on time interval Ti. Nevertheless, the switch turning-on time interval Ti is gradually reduced with the lapse of time over the entire period of the switch conduction control. Even though an inequality sign $\geqq$ in the inequality expression may be replaced with the equality sign =; however, it is not allowed to replace each of the inequality signs ≧ in the inequality expression with the equality sign =.

Thus, it is possible to reduce the length of time it takes to complete a sequence of switch conduction control operations which are commenced at the start of the switch conduction control in comparison with a configuration in which the switch turning-on time intervals between the starts of the systems are deliberately made uniform.

Figure 9C:
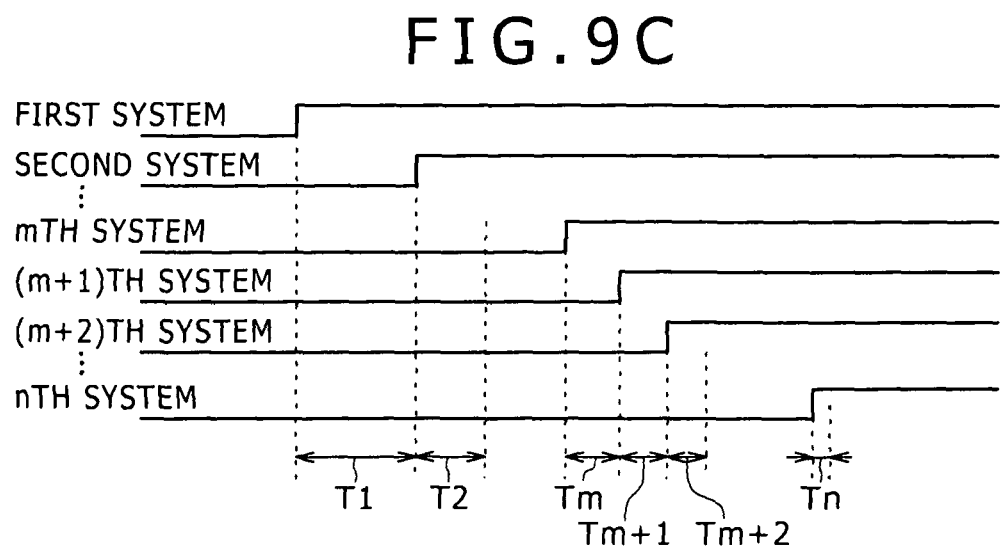
FIG. 9C is a waveform diagram showing activate-timing charts of control lines.

FIG. 9C is a waveform diagram showing timing charts of the control signals CL each connected to one of the systems.

FIG. 10 is an explanatory diagram showing a configuration which is designed so that, the larger the number assigned to a system, the larger the number of unit transistors. By increasing the number of unit transistors, the conducting-state resistance of the switch transistor SWT for the system can be decreased finely.

If the number of systems increases, the number of control signals CL rises. With the raised number of control signals CL, however, the larger control-signal arrangement space occupied by the control signals CL may be the main cause of the increased area in some cases. In order to reduce the number of systems without decreasing the number of different values assigned to the conducting-state resistance, it can adopt a technique whereby each of the systems is configured by connecting unit transistors in parallel and increase the number of unit transistors included in a system with the number assigned to the system as shown in the explanatory diagram of FIG. 10.

If a space is wasted due to variations of the unit-transistor count from system to system, the switch transistors SWT are arranged to form a matrix in place of an array shown in the diagrams of FIGS. 5, 6A and 7A. Then, switch transistors SWT in each system shown in the explanatory diagram are connected to each other by making use of wires through adoption of the branch structure as shown in FIG. 10.

Each of the embodiments described above executes conduction control on switch transistors SWT connected in parallel between a first voltage line which can be the real VSS line 2S and a second voltage line which can be the virtual VSS line 30S or the virtual VSS line 20T, gradually increasing the number of aforementioned switch transistors SWT each put in a conductive state. Thus, each of the embodiments offers a merit that it is possible to reduce the length of time it takes to complete a sequence of conduction controls which are commenced at the start of the conduction control while repressing the peak of variations of a voltage appearing on the first voltage line, that is, repressing the peak of power-supply noises.

In addition, it should be understood by those skilled in the art that a variety of modifications, combinations, sub-combinations and alterations may occur, depending on design requirements and other factors as far as they are within the scope of the appended claims or the equivalents thereof.

What is claimed is:

1. A semiconductor integrated circuit comprising:
a first voltage line on which a specific one of a power-supply voltage and a reference voltage appears;
a second voltage line;
a plurality of circuit cells each receiving power generated as a difference between a voltage appearing on said second voltage line and the other one of said power-supply voltage and said reference voltage;
a plurality of switch transistors connected in parallel between said first and second voltage lines to serve as switch transistors including switch transistors having conducting-state resistances which are different from each other; and a switch conduction control section configured to control a transition of each of said switch transistors from a non-conducting state to a conducting state at separate points of time while abiding by a rule stating: any specific one of said switch transistors shall be put in a conducting state only after all said switch transistors each having a conducting-state resistance greater than the conducting-state resistance of said specific switch transistor have been put in a conducting state.

2. The semiconductor integrated circuit according to claim 1 wherein each of said switch transistors employs a plurality of unit transistors which are controlled by said switch conduction control section to be turned on or turned off at the same time and have a uniform conducting-state resistance.

3. The semiconductor integrated circuit according to claim 1 wherein, when controlling a transition of each of said switch transistors from a non-conducting state to a conducting state at separate points of time, said switch conduction control section fixes the number of said switch transistors to be controlled at the same point of time for each of said points of time.

4. The semiconductor integrated circuit according to claim 1 wherein, when controlling a transition of each of said switch transistors from a non-conducting state to a conducting state at separate points of time, said switch conduction control section gradually increases the number of said switch transistors to be controlled at the same point of time.

5. The semiconductor integrated circuit according to claim 1 wherein, when controlling a transition of each of said switch transistors from a non-conducting state to a conducting state at separate points of time, said switch conduction control section gradually decreases time intervals of conduction controls.

6. A semiconductor integrated circuit comprising:
a first voltage line on which one of a power-supply voltage and a reference voltage appears;
a second voltage line;
a plurality of circuit cells each receiving power generated as a difference between a voltage appearing on said second voltage line and the other one of said power-supply voltage and said reference voltage;
a plurality of switch transistors connected in parallel between said first and second voltage lines; and
a switch conduction control section configured to control a transition of each of said switch transistors from a non-conducting state to a conducting state by turning on said switch transistors at a plurality of time intervals, each time interval of said plurality of time intervals beginning with a turning on of one of said switch transistors and ending with a turning on of a subsequent other transistor of said switch transistors,
wherein the plurality of time intervals includes a specific time interval that is shorter than a preceding time interval.

7. A power-supply control method to be adopted by a semiconductor integrated circuit including:
a first voltage line on which a specific one of a power-supply voltage and a reference voltage appears;
a second voltage line;
a plurality of switch transistors connected in parallel between said first and second voltage lines to serve as switch transistors including switch transistors having conducting-state resistances which are different from each other; and
a plurality of circuit cells each receiving power generated as a difference between a voltage appearing on said second voltage line and the other one of said power-supply voltage and said reference voltage, said power-supply control method comprising the step of
controlling an operation to supply power to said circuit cells by putting each of said switch transistors in a turned-off state or a turned-on state, through a conduction control of a transition of each of said switch transistors from a non-conducting state to a conducting state at separate points of time while abiding by a rule stating: any specific one of said switch transistors shall be put in a conducting state only after all said switch transistors each having a conducting-state resistance greater than said conducting-state resistance of said specific switch transistor have been put in a conducting state.

8. The power-supply control method to be adopted by a semiconductor integrated circuit, according to claim 7, wherein
each of said switch transistors is configured to include a plurality of unit transistors having uniform conducting-state resistances, controlled through the conduction control to be turned off and turned on at the same point of time; and
during the conduction control, the number of said unit transistors to be controlled simultaneously at the same point of time is made gradually greater.

9. A semiconductor integrated circuit comprising:
a first voltage line including one of a power-supply voltage and a reference voltage;
a second voltage line;
a plurality of circuit cells each receiving power generated as a difference between a voltage included in said second voltage line and the other one of said power-supply voltage and said reference voltage;
a plurality of switch transistors connected in parallel between said first and second voltage lines to serve as switch transistors, the plurality of switch transistors including switch transistors having conducting-state resistances that are different from each other; and a switch conduction control section configured to control a transition of each of said switch transistors from a non-conducting state to a conducting state at separate points of time,
wherein a switch transistor of said plurality of switch transistors is put in a conducting state only after other switch transistors of said plurality of switch transistors having a conducting-state resistance greater than the conducting-state resistance of the switch transistor have been put in a conducting state.

10. The semiconductor integrated circuit according to claim 9, wherein each of said switch transistors employs a plurality of unit transistors that are controlled by said switch conduction control section to be turned on or turned off at the same time and have a uniform conducting-state resistance.

11. The semiconductor integrated circuit according to claim 9, wherein, when controlling a transition of each of said switch transistors from a non-conducting state to a conducting state at separate points of time, said switch conduction control section fixes the number of said switch transistors to be controlled at the same point of time for each of said points of time.

12. The semiconductor integrated circuit according to claim 9, wherein, when controlling a transition of each of said switch transistors from a non-conducting state to a conducting state at separate points of time, said switch conduction control section gradually increases the number of said switch transistors to be controlled at the same point of time.

13. The semiconductor integrated circuit according to claim 9, wherein, when controlling a transition of each of said switch transistors from a non-conducting state to a conducting state at separate points of time, said switch conduction control section gradually decreases time intervals of conduction controls.

* * * * *